United States Patent
Motoyama et al.

(10) Patent No.: US 12,402,329 B2
(45) Date of Patent: Aug. 26, 2025

(54) TOP VIA CONTAINING RANDOM-ACCESS MEMORY CROSS-BAR ARRAY

(71) Applicant: International Business Machines Corporation, Armonk, NY (US)

(72) Inventors: Koichi Motoyama, Clifton Park, NY (US); Hsueh-Chung Chen, Cohoes, NY (US); Chanro Park, Clifton Park, NY (US); Kenneth Chun Kuen Cheng, Shatin (HK); Chih-Chao Yang, Glenmont, NY (US)

(73) Assignee: International Business Machines Corporation, Armonk, NY (US)

( * ) Notice: Subject to any disclaimer, the term of this patent is extended or adjusted under 35 U.S.C. 154(b) by 784 days.

(21) Appl. No.: 17/453,354

(22) Filed: Nov. 3, 2021

(65) Prior Publication Data

US 2023/0139648 A1    May 4, 2023

(51) Int. Cl.
*H10B 63/00*    (2023.01)
*H10B 61/00*    (2023.01)
(Continued)

(52) U.S. Cl.
CPC ............. *H10B 63/80* (2023.02); *H10B 61/00* (2023.02); *H10N 50/01* (2023.02); *H10N 50/10* (2023.02);
(Continued)

(58) Field of Classification Search
CPC ........ H10B 63/80; H10B 61/00; H10N 50/01; H10N 50/10; H10N 50/80; H10N 70/021; H10N 70/8833; H10N 70/826
See application file for complete search history.

(56) References Cited

U.S. PATENT DOCUMENTS

| 4,536,951 A | 8/1985 | Rhodes et al. |
| 5,693,568 A | 12/1997 | Liu et al. |

(Continued)

FOREIGN PATENT DOCUMENTS

| CN | 113437072 A | * | 9/2021 | ....... H01L 21/02601 |
| DE | 102016100272 B4 | * | 1/2020 | ....... H01L 21/76838 |

(Continued)

OTHER PUBLICATIONS

Croes et al., "Interconnect metals beyond copper: reliability challenges and opportunities", https://www.researchgate.net/publication/330585273_Interconnect_metals_beyond_copper_reliability_challenges_and_opportunities, EDM18-111-113, © 2018 IEEE, 4 pgs.

*Primary Examiner* — Mohammed Shamsuzzaman
(74) *Attorney, Agent, or Firm* — Matthew Zehrer

(57) ABSTRACT

Disclosed is a memory device. The memory device comprises a cross-bar array of memory cells. The cross-bar array of memory cells comprises a plurality of bottom level lines arranged in a first direction. The cross-bar array of memory cells further comprises a plurality of vias arranged on top of each of the plurality of bottom level lines. The cross-bar array of memory cells further comprises a plurality of memory cells. Each memory cell is arranged on top of one of the plurality of vias. The cross-bar array of memory cells further comprises a plurality of top level lines arranged in a second direction that is substantially perpendicular to the first direction. Each top level line is arranged on top of and electrically connected to two or more memory cells.

17 Claims, 12 Drawing Sheets

(51) Int. Cl.
*H10N 50/01* (2023.01)
*H10N 50/10* (2023.01)
*H10N 50/80* (2023.01)
*H10N 70/00* (2023.01)

(52) U.S. Cl.
CPC ........... *H10N 50/80* (2023.02); *H10N 70/021* (2023.02); *H10N 70/8833* (2023.02)

(56) References Cited

U.S. PATENT DOCUMENTS

| | | | |
|---|---|---|---|
| 6,611,453 B2 | 8/2003 | Ning | |
| 6,783,999 B1 | 8/2004 | Lee | |
| 8,373,440 B2 * | 2/2013 | Strukov | H10B 63/84 |
| | | | 326/103 |
| 8,921,960 B2 | 12/2014 | Yang et al. | |
| 9,595,670 B1 * | 3/2017 | Gee | H10N 70/883 |
| 9,613,861 B2 | 4/2017 | Anderson et al. | |
| 9,806,129 B2 * | 10/2017 | Ravasio | H10B 63/24 |
| 9,818,478 B2 * | 11/2017 | Chung | G11C 13/0004 |
| 10,050,194 B1 * | 8/2018 | Nardi | H10N 70/8616 |
| 10,319,908 B2 * | 6/2019 | Narayanan | H10N 70/063 |
| 10,546,892 B1 * | 1/2020 | Ando | H10B 63/80 |
| 11,177,437 B2 * | 11/2021 | Tang | H01L 23/544 |
| 2002/0155693 A1 | 10/2002 | Hong et al. | |
| 2011/0272664 A1 * | 11/2011 | Tada | H10N 70/826 |
| | | | 257/4 |
| 2012/0225534 A1 * | 9/2012 | Lee | H10N 70/231 |
| | | | 257/E45.002 |
| 2013/0221316 A1 * | 8/2013 | Greene | H10N 70/8845 |
| | | | 257/4 |
| 2014/0042567 A1 * | 2/2014 | Jung | H10N 50/10 |
| | | | 257/E43.001 |
| 2015/0056800 A1 | 2/2015 | Mebarki et al. | |
| 2015/0137061 A1 | 5/2015 | Donghi et al. | |
| 2015/0144859 A1 * | 5/2015 | Chen | H10N 70/066 |
| | | | 257/4 |
| 2015/0243885 A1 * | 8/2015 | Sciarrillo | H10N 70/063 |
| | | | 438/381 |
| 2017/0040216 A1 * | 2/2017 | Anderson | H01L 23/5226 |
| 2019/0214558 A1 * | 7/2019 | Ando | G11C 13/003 |
| 2019/0371744 A1 * | 12/2019 | Brown | H01F 41/02 |
| 2020/0028080 A1 * | 1/2020 | Ando | H10N 70/8836 |
| 2020/0144498 A1 * | 5/2020 | Yang | H10N 50/10 |
| 2020/0258941 A1 * | 8/2020 | Lee | H10N 70/826 |
| 2020/0373487 A1 * | 11/2020 | Wang | H10N 70/826 |
| 2021/0098693 A1 * | 4/2021 | Chuang | H10N 50/01 |
| 2021/0135102 A1 * | 5/2021 | Lin | G11C 13/0007 |
| 2021/0193920 A1 * | 6/2021 | Ando | H10N 70/826 |
| 2022/0036947 A1 * | 2/2022 | Tomita | G06N 3/084 |
| 2023/0047263 A1 * | 2/2023 | Verdy | H10B 63/24 |
| 2023/0051017 A1 * | 2/2023 | Gluschenkov | H10N 70/8833 |
| 2023/0157181 A1 * | 5/2023 | Dutta | H10N 50/10 |
| | | | 257/421 |

FOREIGN PATENT DOCUMENTS

| | | | |
|---|---|---|---|
| FR | 2973554 A1 * | 10/2012 | ......... G11C 13/0007 |
| WO | WO-2012030320 A1 * | 3/2012 | ......... G11C 13/0007 |
| WO | WO-2013039603 A1 * | 3/2013 | ............ H01L 45/08 |

\* cited by examiner

TOP VIA CONTAINING RANDOM-ACCESS MEMORY CROSS-BAR ARRAY

BACKGROUND

The present invention relates in general to semiconductor fabrication methods and resulting structures. More specifically, the present invention relates to forming resistive random-access memory cross-bar arrays in vias.

Random-access memory (RAM) is a form of computer memory that can be read and changed. RAM is typically used to store working data and machine code. Non-volatile random-access memory (NVRAM) is RAM that retains data without applied power. Resistive random-access memory (RRAM or ReRAM) is a type of NVRAM that stores data by changing the resistance across a dielectric solid-state material. Magnetoresistive random-access memory (MRAM) is a type of NVRAM which stores data in magnetic domains.

SUMMARY

Embodiments of the present invention include fabrication methods and the corresponding structures. In some embodiments, the fabrication method comprises forming a bottom electrode. The bottom electrode comprises a via on top of a bottom level line. The method further comprises depositing one or more memory layers on top of the via. The method further comprises depositing an isolation layer on top of the one or more memory layers to form a memory stack. The method further comprises encapsulating the memory stack with a low-k dielectric material. The method further comprises exposing a top surface of the one or more memory layers. The method further comprises forming a top electrode on top of the one or more memory layers.

Additional embodiments of the present disclosure include a memory cell. The memory cell comprises a bottom electrode. The bottom electrode comprises a via arranged on top of a bottom line. The memory cell further comprises a memory stack arranged on top of the via. The memory stack comprises one or more memory layers that are configured to store data and an isolation layer that surrounds the lateral sides of the one or more memory layers. The memory cell further comprises an encapsulation layer arranged on top of the substantially horizontal portions of the isolation layer. The top surface of the encapsulation layer is substantially coplanar with a top surface of the memory stack. The memory cell further comprises a top metallization layer arranged on top of the memory stack and the encapsulation layer. The top metallization layer is in direct contact with a top surface of the one or more memory layers.

Further embodiments of the present disclosure include a memory device. The memory device comprises a cross-bar array of memory cells. The cross-bar array of memory cells comprises a plurality of bottom level lines arranged in a first direction. The cross-bar array of memory cells further comprises a plurality of vias arranged on top of each of the plurality of bottom level lines. The cross-bar array of memory cells further comprises a plurality of memory cells. Each memory cell is arranged on top of one of the plurality of vias. The cross-bar array of memory cells further comprises a plurality of top level lines arranged in a second direction that is substantially perpendicular to the first direction. Each top level line is arranged on top of and electrically connected to two or more memory cells.

The above summary is not intended to describe each illustrated embodiment or every implementation of the present disclosure.

BRIEF DESCRIPTION OF THE DRAWINGS

The drawings included in the present disclosure are incorporated into, and form part of, the specification. They illustrate embodiments of the present disclosure and, along with the description, serve to explain the principles of the disclosure. The drawings are only illustrative of typical embodiments and do not limit the disclosure.

Figure 1:
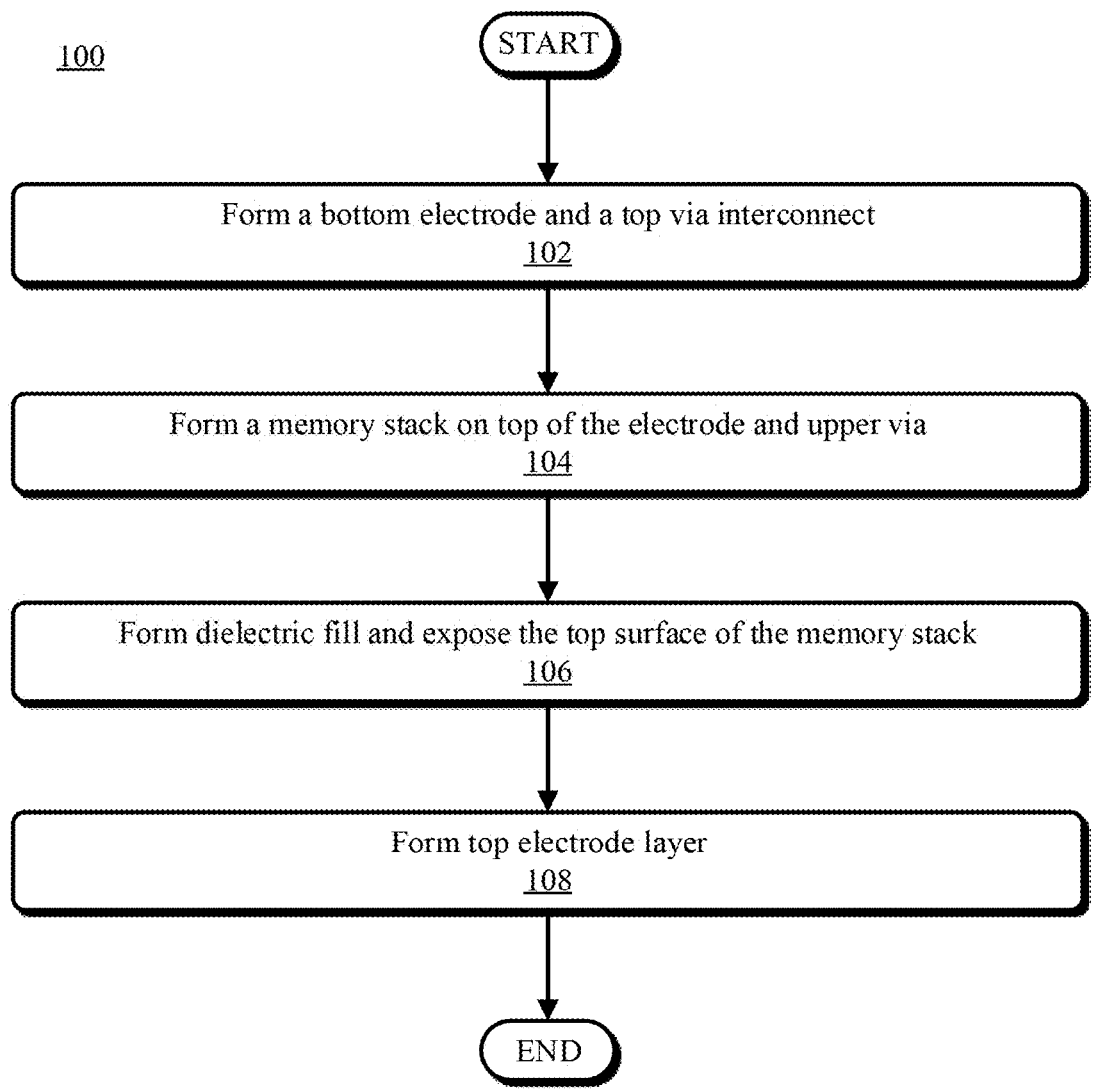
FIG. 1 illustrates a flowchart of an example method for forming a semiconductor component, in accordance with embodiments of the present disclosure.

While the embodiments described herein are amenable to various modifications and alternative forms, specifics thereof have been shown by way of example in the drawings and will be described in detail. It should be understood, however, that the particular embodiments described are not to be taken in a limiting sense. On the contrary, the intention is to cover all modifications, equivalents, and alternatives falling within the spirit and scope of the invention.

DETAILED DESCRIPTION

Embodiments of the present invention are generally directed to semiconductor fabrication methods and resulting structures, and more particularly to computer memory devices and methods of making computer memory devices. While the present disclosure is not necessarily limited to such applications, various aspects of the disclosure may be appreciated through a discussion of various examples using this context.

Various embodiments of the present disclosure are described herein with reference to the related drawings, where like numbers refer to the same component. Alternative embodiments can be devised without departing from the scope of the present disclosure. It is noted that various connections and positional relationships (e.g., over, below, adjacent, etc.) are set forth between elements in the following description and in the drawings. These connections and/or positional relationships, unless specified otherwise, can be direct or indirect, and the present disclosure is not intended to be limiting in this respect. Accordingly, a coupling of entities can refer to either a direct or an indirect coupling, and a positional relationship between entities can be a direct or indirect positional relationship. As an example of an indirect positional relationship, references in the present description to forming layer "A" over layer "B" include situations in which one or more intermediate layers (e.g., layer "C") is between layer "A" and layer "B" as long as the relevant characteristics and functionalities of layer "A" and layer "B" are not substantially changed by the intermediate layer(s).

The following definitions and abbreviations are to be used for the interpretation of the claims and the specification. As used herein, the terms "comprises," "comprising," "includes," "including," "has," "having," "contains" or "containing," or any other variation thereof, are intended to cover a non-exclusive inclusion. For example, a composition, a mixture, process, method, article, or apparatus that comprises a list of elements is not necessarily limited to only those elements but can include other elements not expressly listed or inherent to such composition, mixture, process, method, article, or apparatus.

For purposes of the description hereinafter, the terms "upper," "lower," "right," "left," "vertical," "horizontal," "top," "bottom," and derivatives thereof shall relate to the described structures and methods, as oriented in the drawing figures. The terms "overlying," "atop," "on top," "positioned on" or "positioned atop" mean that a first element, such as a first structure, is present on a second element, such as a second structure, wherein intervening elements such as an interface structure can be present between the first element and the second element. The term "direct contact" means that a first element, such as a first structure, and a second element, such as a second structure, are connected without any intermediary conducting, insulating or semiconductor layers at the interface of the two elements. It should be noted, the term "selective to," such as, for example, "a first element selective to a second element," means that a first element can be etched, and the second element can act as an etch stop.

As used herein, the articles "a" and "an" preceding an element or component are intended to be nonrestrictive regarding the number of instances (i.e. occurrences) of the element or component. Therefore, "a" or "an" should be read to include one or at least one, and the singular word form of the element or component also includes the plural unless the number is obviously meant to be singular.

As used herein, the terms "invention" or "present invention" are non-limiting terms and not intended to refer to any single aspect of the particular invention but encompass all possible aspects as described in the specification and the claims.

The terms "about," "substantially," "approximately," "slightly less than," and variations thereof, are intended to include the degree of error associated with measurement of the particular quantity based upon the equipment available at the time of filing the application. For example, "about" can include a range of ±8% or 5%, or 2% of a given value.

For the sake of brevity, conventional techniques related to semiconductor device and integrated circuit (IC) fabrication may or may not be described in detail herein. Moreover, the various tasks and process steps described herein can be incorporated into a more comprehensive procedure or process having additional steps or functionality not described in detail herein. In particular, various steps in the manufacture of semiconductor devices and semiconductor-based ICs are well known and so, in the interest of brevity, many conventional steps will only be mentioned briefly herein or will be omitted entirely without providing the well-known process details.

In general, the various processes used to form a microchip that will be packaged into an IC fall into four general categories, namely, film deposition, removal/etching, semiconductor doping and patterning/lithography.

Deposition is any process that grows, coats, or otherwise transfers a material onto the wafer. Available technologies include physical vapor deposition (PVD), chemical vapor deposition (CVD), electrochemical deposition (ECD), molecular beam epitaxy (MBE) and more recently, atomic layer deposition (ALD) among others. Another deposition technology is plasma enhanced chemical vapor deposition (PECVD), which is a process which uses the energy within the plasma to induce reactions at the wafer surface that would otherwise require higher temperatures associated with conventional CVD. Energetic ion bombardment during PECVD deposition can also improve the film's electrical and mechanical properties.

Removal/etching is any process that removes material from the wafer. Examples include etch processes (either wet or dry), chemical-mechanical planarization (CMP), and the like. One example of a removal process is ion beam etching (IBE). In general, IBE (or milling) refers to a dry plasma etch method which utilizes a remote broad beam ion/plasma source to remove substrate material by physical inert gas and/or chemical reactive gas means. Like other dry plasma etch techniques, IBE has benefits such as etch rate, anisotropy, selectivity, uniformity, aspect ratio, and minimization of substrate damage. Another example of a dry removal process is reactive ion etching (RIE). In general, RIE uses chemically reactive plasma to remove material deposited on wafers. With RIE the plasma is generated under low pressure (vacuum) by an electromagnetic field. High-energy ions from the RIE plasma attack the wafer surface and react with it to remove material.

Semiconductor doping is the modification of electrical properties by doping, for example, transistor sources and drains, generally by diffusion and/or by ion implantation. These doping processes are followed by furnace annealing or by rapid thermal annealing ("RTA"). Annealing serves to activate the implanted dopants. Films of both conductors (e.g., poly-silicon, aluminum, copper, etc.) and insulators (e.g., various forms of silicon dioxide, silicon nitride, etc.) are used to connect and isolate transistors and their components. Selective doping of various regions of the semiconductor substrate allows the conductivity of the substrate to be changed with the application of voltage. By creating structures of these various components, millions of transistors can be built and wired together to form the complex circuitry of a modern microelectronic device.

Semiconductor lithography is the formation of three-dimensional relief images or patterns on the semiconductor substrate for subsequent transfer of the pattern to the substrate. In semiconductor lithography, the patterns are formed by a light sensitive polymer called a photo-resist.

To build the complex structures that make up a transistor and the many wires that connect the millions of transistors of a circuit, lithography and etch pattern transfer steps are repeated multiple times. Each pattern being printed on the wafer is aligned to the previously formed patterns and gradually the conductors, insulators and selectively doped regions are built up to form the final device.

Turning now to an overview of technologies that are more specifically relevant to aspects of the present disclosure, Random-access memory (RAM) is a form of computer memory that can be read and changed. RAM is typically used to store working data and machine code. Non-volatile random-access memory (NVRAM) is RAM that retains data without applied power. Resistive random-access memory (RRAM or ReRAM) is a type of NVRAM which stores data by changing the resistance across a dielectric solid-state material. Magnetoresistive random-access memory (MRAM) is a type of NVRAM which stores data in magnetic domains.

More specifically, data is stored in RRAM by modifying the electrical properties of a dielectric solid-state material according to the value that is to be stored in the cell. Generally, this involves generating defects in a thin oxide layer, such as oxygen vacancies. Oxygen vacancies are oxide bond locations where the oxygen has been removed. The vacancies and oxygen ions can charge and drift under an electric field, and this motion is analogous to the motion of electrons and holes in a semiconductor. Each RRAM cell can be programmed into one of multiple different resistance states, which correspond to the data stored therein (e.g., binary 1s and 0s), by applying an external bias across the RRAM cell. For example, application of a certain bias can put the RRAM cell into a high resistance state, which may correspond to a first binary value (e.g., 0), and application of a different bias can put the RRAM cell into a low resistance state, which may correspond to a second binary value (e.g., 1).

In contrast, data in MRAM is stored by magnetic storage elements. The elements are formed from two ferromagnetic plates, each of which can hold a magnetization, separated by a thin insulating layer. One of the two plates is a permanent magnet set to a particular polarity. This plate may also be referred to as the reference layer. The other plate's magnetization can be changed to match that of an external field to store memory. This plate may also be referred to as the free layer. The thin insulating layer separating the two may also be referred to as a tunnel barrier layer, because electrons can tunnel through it from one ferromagnetic plate into the other. This configuration is known as a magnetic tunnel junction (MTJ) or an MTJ stack, and it provides the physical structure for an MRAM bit. A memory device is built from a grid of such "cells."

Each memory cell comprises a memory stack sandwiched between an upper electrical contact and a lower electrical contact so that electrical current can flow through the memory stack. The upper electrical contact may also be referred to as a top electrode, and the lower electrical contact may also be referred to as a bottom electrode. The top and bottom electrodes functionally interconnect and integrate the cell into the memory device.

During conventional crossbar memory fabrication processes, the bottom electrode is formed prior to the memory stack. The memory stack is then formed on top of the bottom electrode by performing a sequence of patterning and etching of the memory layers. Etching the memory layers can include, for example, performing one or more dry etching processes, such as reactive ion etching (RIE) and/or ion beam etching (IBE) processes. However, such processes typically lead to process-induced damage to edges of the memory stack, as well as contamination of the memory stack. Accordingly, the properties and reliability of the resulting memory device can be negatively impacted.

Embodiments of the present disclosure may overcome these and other drawbacks of existing solutions by forming a protective barrier of dielectric material around the memory stack. Such a protective barrier enables the memory stack to be formed and connected to the surrounding interconnect structures without the memory stack from being impacted by subsequent etching procedures, thereby preventing process-induced damage and contamination of the memory stack.

In some embodiments, the memory devices comprises a plurality of memory cells built into top vias. The process comprises forming bottom electrodes with top vias using, for example, a subtractive etch approach. The bottom electrodes may be lines with top vias built thereon. Memory stacks are then deposited over the top-vias of the bottom electrodes. The memory stacks may be formed by conformal depositions of one or more memory layers, which collectively create a memory component, and an isolation, or protecting, layer. An encapsulating layer is then deposited over the memory stacks. One or more etching and/or planarization processes are performed in order to reduce the top of the encapsulation layer and the isolation layer to expose a top surface of the memory layer. The second level metals (e.g., a top line, which acts as the top electrode for the memory cell(s)) is then formed on top of the exposed memory stack to create a memory cell in the top via.

As a result of the process, a memory device is fabricated in which individual memory cells are formed on top of vias that connect layers of the semiconductor structure. In particular, embodiments of the present disclosure include a cross-bar array with memory cells that do not include process-induced damage or contamination. The bottom electrode of the cross-bar array consists of a via sitting on top of metal lines. The memory stack is deposited conformally over the bottom electrode. An upper level line (also referred to herein as a second level line) acts as the top electrode. The memory stack can include numerous different types of memory cells, including, for example, RRAM, phase-change memory (PCM), MRAM, etc.

Because the memory stack does not go through an RIE process, there is no process-induced damage to the memory region. In addition, the memory stack is not deposited into vias, instead sitting on top of the vias. As a result, the memory stack thickness is substantially uniform across the memory cells in the cross-bar array.

Figure 2:
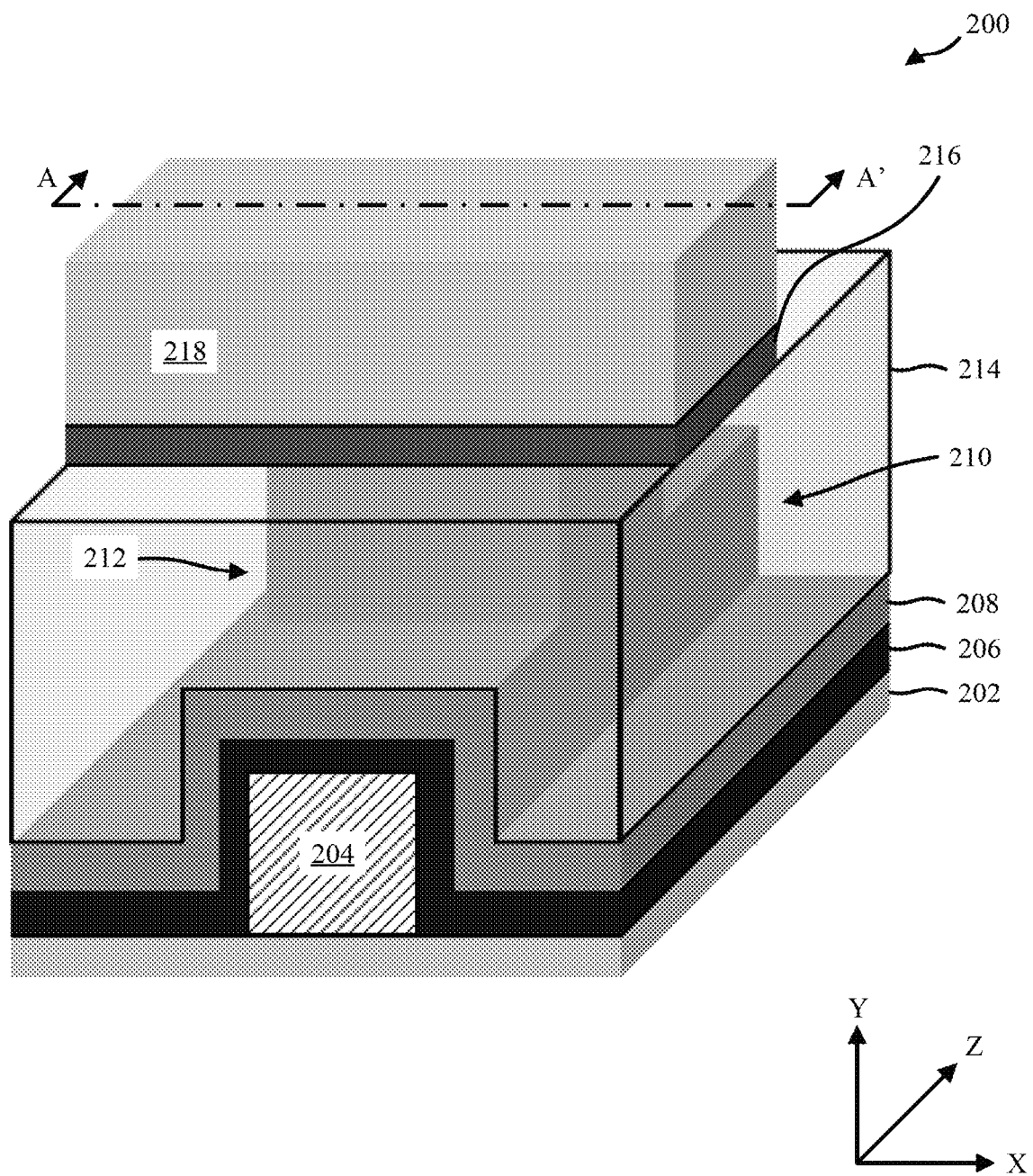
FIG. 2 is a schematic diagram illustrating an example memory device, in accordance with embodiments of the present disclosure.

Turning now to the figures, FIG. 1 illustrates a flowchart of an example method 100 for forming a memory device, in accordance with embodiments of the present disclosure. FIG. 2 illustrates an isometric view of the memory device after performance of the method 100. FIGS. 3A-11 illustrate the memory device at various intermediate stages in the fabrication process. In particular, FIGS. 3A-10B illustrate an embodiment of the present disclosure in which the memory device includes an RRAM cell stacked on top of a via. Additionally, figures that end in "A" (e.g., FIG. 3A, FIG. 4A, etc.) show the memory device from the front (e.g., looking along direction Z shown in FIG. 2), and figures that end in "B" (e.g., FIG. 3B, FIG. 4B, etc.) show the memory device from the size (e.g., looking along direction X shown in FIG. 2). FIG. 11 illustrates a sectional view of the memory device along cut A-A' (shown in FIG. 2).

Referring first to FIG. 1, the method 100 may be performed by, for example, hardware, software, firmware, or any combination thereof. For example, the method 100 may be performed by computer systems of a semiconductor fabrication plant controlling fabrication equipment. The method 100 begins at operation 102, wherein a bottom electrode and a top via interconnect is formed.

More specifically, the performance of operation 102 includes forming a bottom electrode on top of a lower level. In some embodiments, the lower level may be a substrate. For example, the bottom electrode may be a lower level line interconnect that is deposited on top of a dielectric substrate. In accordance with at least one alternative embodiment, the performance of operation 102 can further include forming the lower level, including forming the metal interconnect structure in the dielectric material, and forming a bottom electrode on top of the metal interconnect structure.

Regardless of whether the lower level is already formed prior to the performance of operation 102 or if the lower level acts as the bottom electrode, the metal interconnect structure formed in the lower level can be, for example, a line configured to transmit power and/or signal.

In addition to forming the bottom electrode/line, a via is formed on top of the bottom electrode. The bottom electrode/line and via can be formed using either a damascene flow process or a subtractive flow process in different combinations and orders within the context of two main integration schemes for forming interconnect structures. A damascene flow refers to the processes of forming interconnect structures by depositing an oxide layer, forming a trench into the oxide layer, and then depositing metal into the trench. Alternatively, a subtractive flow refers to processes of forming interconnect structures by depositing metal, and then etching the metal to form the interconnect structures.

In some embodiments, the via may be formed of the same material as the bottom electrode. This may be particularly advantageous when using a subtractive flow process. For example, a thick layer (e.g., as thick as the resulting electrode and via stack) of a conductive material (e.g., Co, Cu, Ru, etc.) may be deposited onto a substrate. The layer may then be selectively patterned and etched such that the resulting structure includes a line as the bottom electrode and one or more top vias on top of the bottom electrode. In some alternative embodiments, the via and the bottom electrode may be formed of different conductors.

Figure 3A:
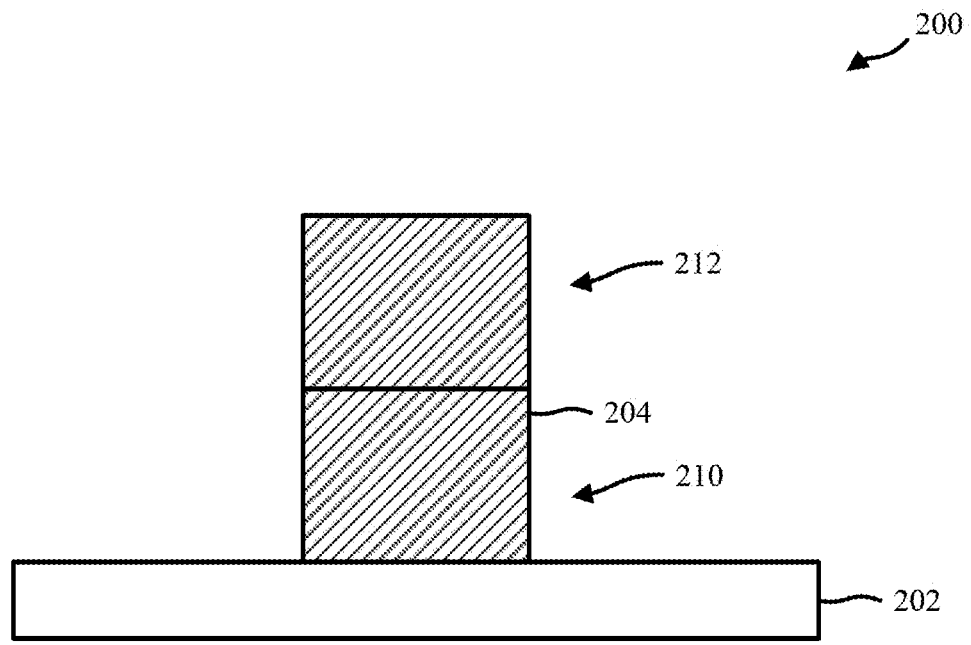
FIG. 3A illustrates a front view of an example semiconductor structure following the performance of a portion of the example method of FIG. 1, in accordance with embodiments of the present disclosure.
Figure 3B:
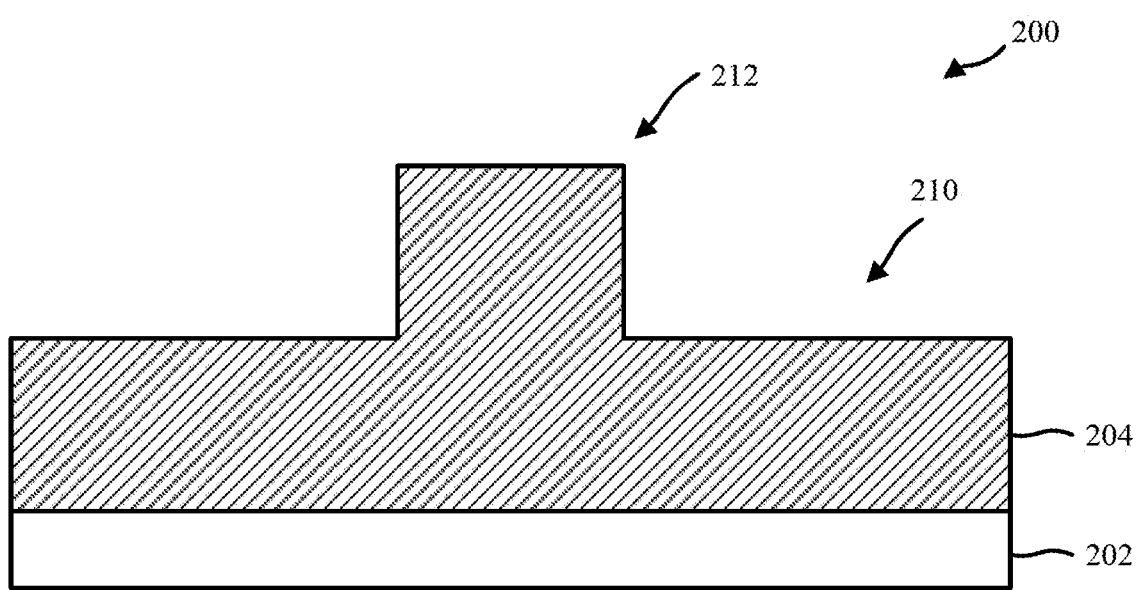
FIG. 3B illustrates a side view of the example semiconductor structure of FIG. 3A, in accordance with embodiments of the present disclosure.

FIGS. 3A and 3B show a memory device 200 after performance of operation 102. As shown in FIGS. 3A and 3B, a layer of conductive material 204 is formed on top of a substrate 202. The substrate 202 may be any suitable material, such as a dielectric, and the layer of conductive material 204 may be any suitable material for forming electrodes and/or via, such as Co, Cu, Ru, etc. The layer of conductive material 204 has two distinct portions: a line portion (also referred to herein as bottom electrode 210) and a via portion (also referred to herein as via 212). The via 212 is arranged on top of a portion of the bottom electrode 210. While the via 212 and the bottom electrode 210 are shown as being made of the same conductive material 204, in some embodiments, the via 212 and the bottom electrode 210 may be different materials.

Referring back to FIG. 1, at operation 104, a memory stack is formed on top of the bottom electrode and the upper via. The memory stack includes at least one memory material capable of storing data and at least protective isolation layer. For example, in some embodiments, operation 104 includes performing a blanket deposition of a hafnium oxide (e.g., HfO2) or other suitable RRAM material over the bottom electrode, top via, and substrate. In other embodiments, operation 104 may include forming a MTJ stack on top of the top via. Accordingly, the memory stack may comprise one or more layers of material deposited on the top via, depending on the type of memory cell being fabricated.

Figure 4A:
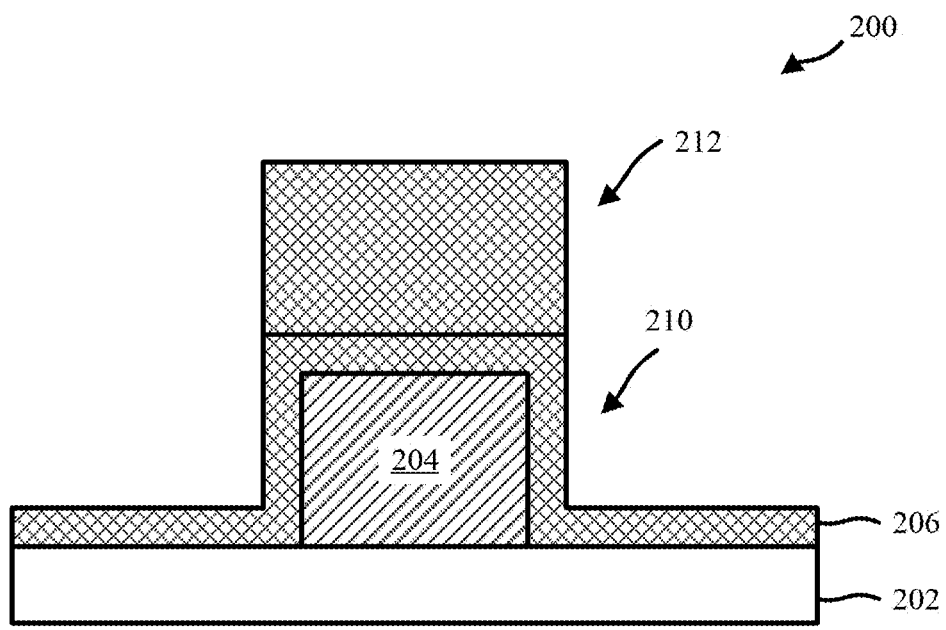
FIG. 4A illustrates a front view of an example of the semiconductor structure of FIG. 3A following the performance of additional fabrication operations, in accordance with embodiments of the present disclosure.
Figure 4B:
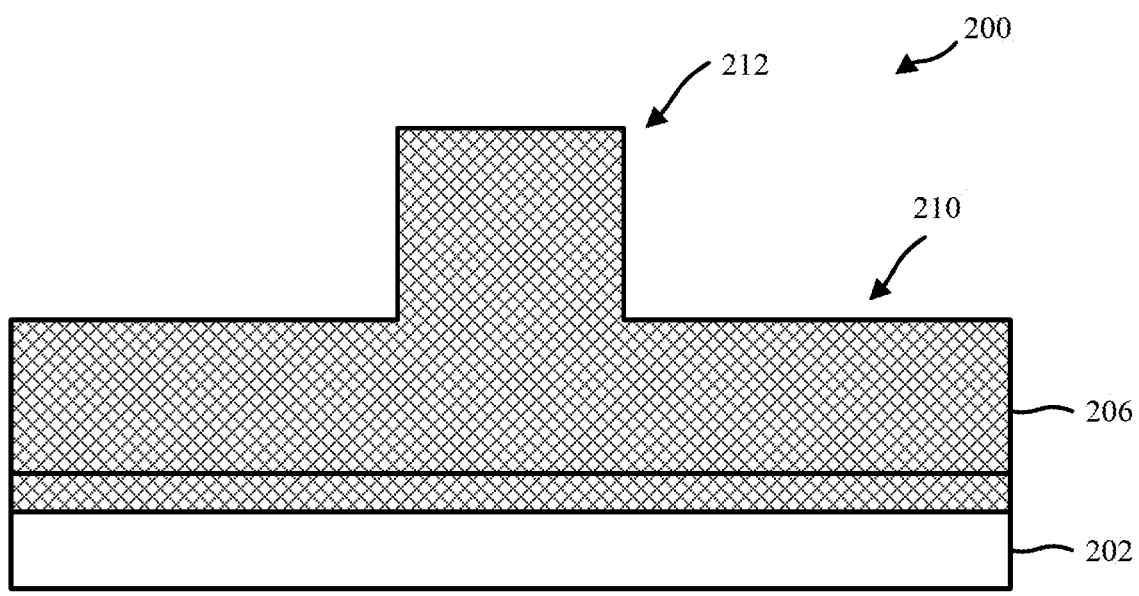
FIG. 4B illustrates a side view of the example semiconductor structure of FIG. 4A, in accordance with embodiments of the present disclosure.

FIGS. 4A and 4B show a memory device 200 after performance of this portion of operation 104. As shown in FIGS. 4A and 4B, a layer of memory material 206 is deposited on top of the bottom electrode 210 and via 212. In particular, FIGS. 4A and 4B illustrate an embodiment where the memory material 206 comprises a single layer of HfOx deposited over the bottom electrode 210 and the via 212. Additionally, in this embodiment, the memory layer 206 is blanket deposited such that it also covers previously exposed portions of the substrate 202, as shown in FIG. 4A. However, in some embodiments, the memory layer 206 may be selectively deposited over just the bottom electrode 210 and via 212 such that the tops and sidewalls of the bottom electrode 210 and via 212 are covered by the memory layer 206, but portions of the substrate 202 are still exposed.

Additionally, while the example in FIGS. 4A-4B show a single memory layer 206, it is to be understood that other embodiments may comprises more than one layer. For example, in some embodiments of the present disclosure, the memory layer 206 may be a MTJ formed from multiple layers of materials.

Returning to FIG. 1, operation 104 further comprises depositing a protective isolation layer over the memory layer. The protective isolation layer may be, for example, a silicon nitride (e.g., Si3N4) or other suitable dielectric material. The protective isolation layer may act both to protect the memory layer from subsequent fabrication processes (e.g., etching processes), as well as to isolate the memory layer from other layers in the memory device. As with the memory layer, operation 104 may include a blanket deposition of the silicon nitride over the existing structures of the semiconductor device.

Figure 5A:
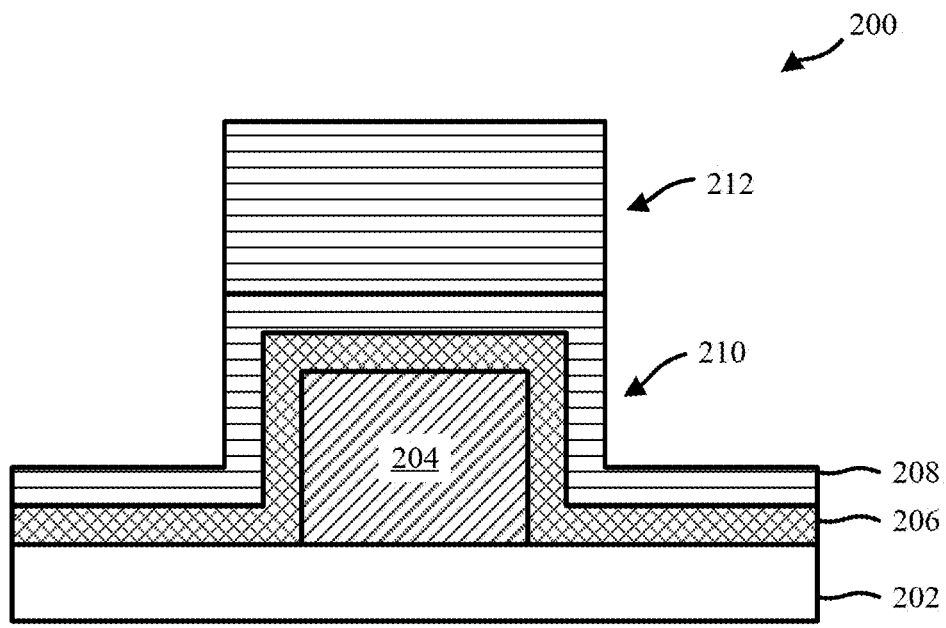
FIG. 5A illustrates a front view of an example of the semiconductor structure of FIG. 4A following the performance of additional fabrication operations, in accordance with embodiments of the present disclosure.
Figure 5B:
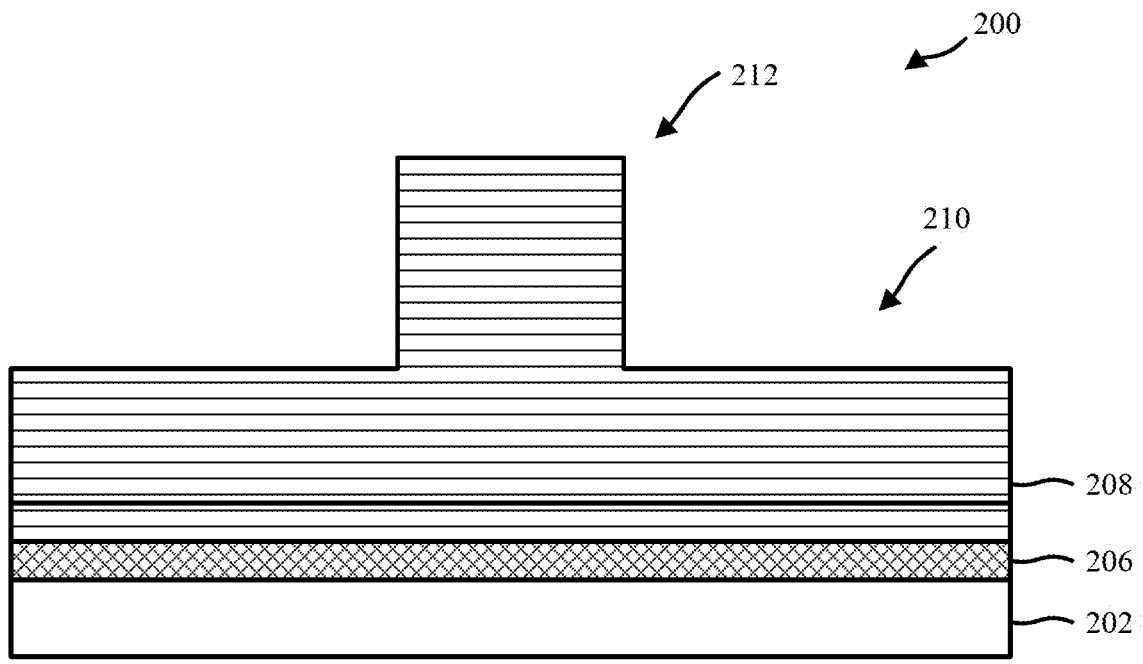
FIG. 5B illustrates a side view of the example semiconductor structure of FIG. 5A, in accordance with embodiments of the present disclosure.

FIGS. 5A and 5B show a memory device 200 after performance of this portion of operation 104. As shown in FIGS. 5A and 5B, an isolation layer 208 is deposited on top of the memory layer 206. In particular, FIGS. 5A and 5B illustrate an embodiment where the isolation layer 208 comprises a single layer of SiN deposited over the memory layer 206. In this embodiment, the isolation layer 208 is blanket deposited such that it covers all of the memory layer 206, not just the portion of the memory layer 206 that is above the bottom electrode 210 and via 212. However, in some embodiments, the isolation layer 208 may be selectively deposited over just the portions of the memory layer 206 that are above the bottom electrode 210 and via 212.

Returning to FIG. 1, at operation 106, the memory device is encapsulated by a low-k dielectric and the top of the memory stack is subsequently exposed. First, operation 106 may include performing a blanket deposition of a low-k dielectric on top of the memory device. The low-k dielectric can be deposited using, for example, flowable chemical vapor deposition (fCVD). The low-k dielectric may be, for example, fluorine-doped silicon dioxide, organosilicate glass dielectrics (e.g., carbon-doped oxides), porous silicon dioxide, or any other suitable low-k dielectric material.

Figure 6A:
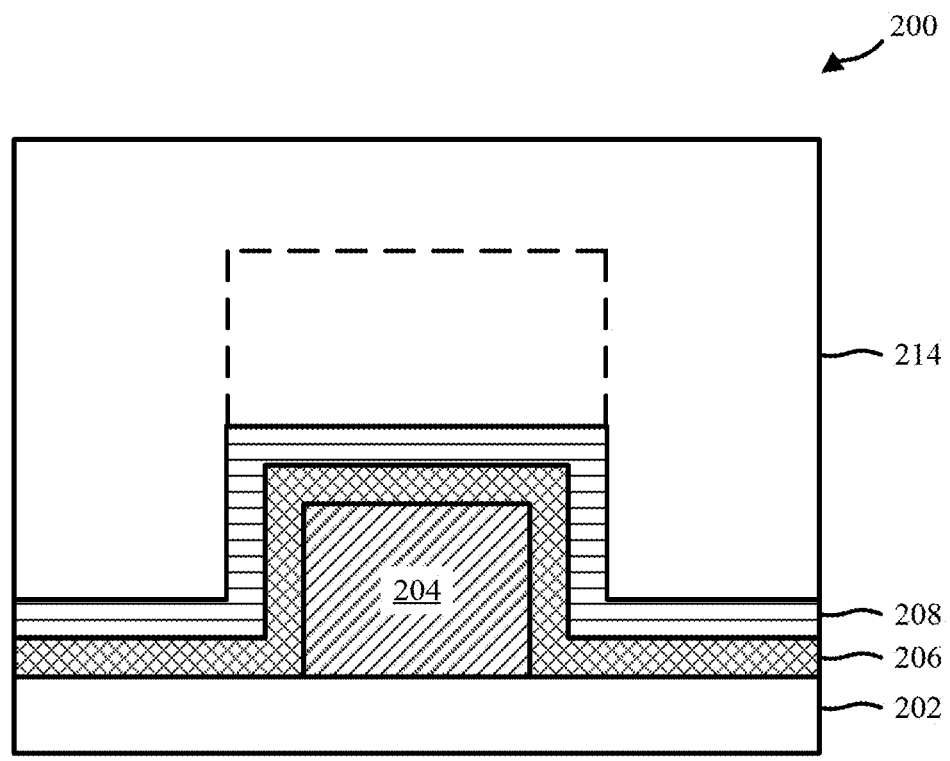
FIG. 6A illustrates a front view of an example of the semiconductor structure of FIG. 5A following the performance of additional fabrication operations, in accordance with embodiments of the present disclosure.
Figure 6B:
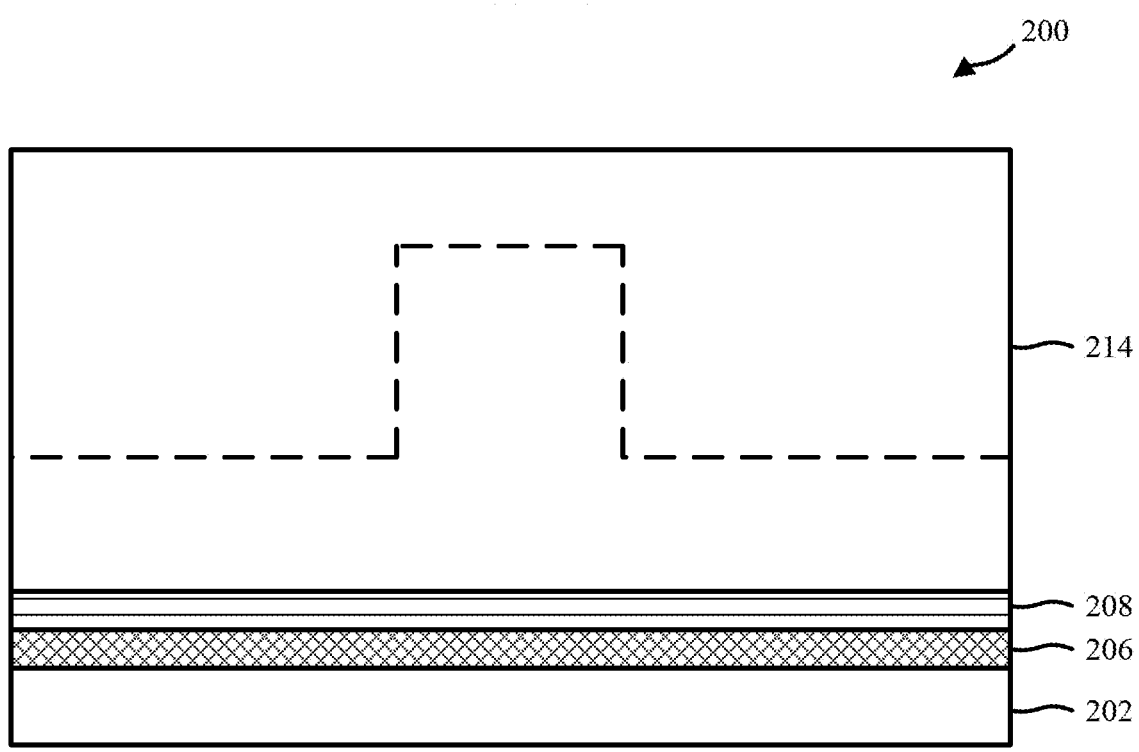
FIG. 6B illustrates a side view of the example semiconductor structure of FIG. 6A, in accordance with embodiments of the present disclosure.

FIGS. 6A and 6B show a memory device 200 after performance of this portion of operation 106. As shown in FIGS. 6A and 6B, an encapsulation layer 214 is deposited on top of the isolation layer 208. In particular, FIGS. 6A and 6B illustrate an embodiment where the encapsulation layer 214 comprises a single layer of a low-k material deposited over the isolation layer 208. In this embodiment, the encapsulation layer 214 is blanket deposited such that it covers all of the isolation layer 208.

Additionally, as shown in FIGS. 6A and 6B, the encapsulation layer 214 completely surrounds the bottom electrode and via stack and extends above the top of the via stack (i.e., the via 212 with the memory layer 206 and isolation layer 208 deposited on top). The dashed line in FIGS. 6A and 6B illustrate the location of the top of the via stack within the encapsulation layer 214. This may be done to ensure that the entirety of the via stack is encapsulated by the encapsulation layer 214.

Returning to FIG. 1, operation 106 further comprises recessing the top of the low-k dielectric and the protective isolation layer to expose a top surface of the memory layer above the via. Exposing the top surface of the memory layer may be done by performing one or more low-k recess and wet etch processes until the top of the memory layer is exposed. In some embodiments, a CMP operation may be performed to expose the memory layer.

Figure 7A:
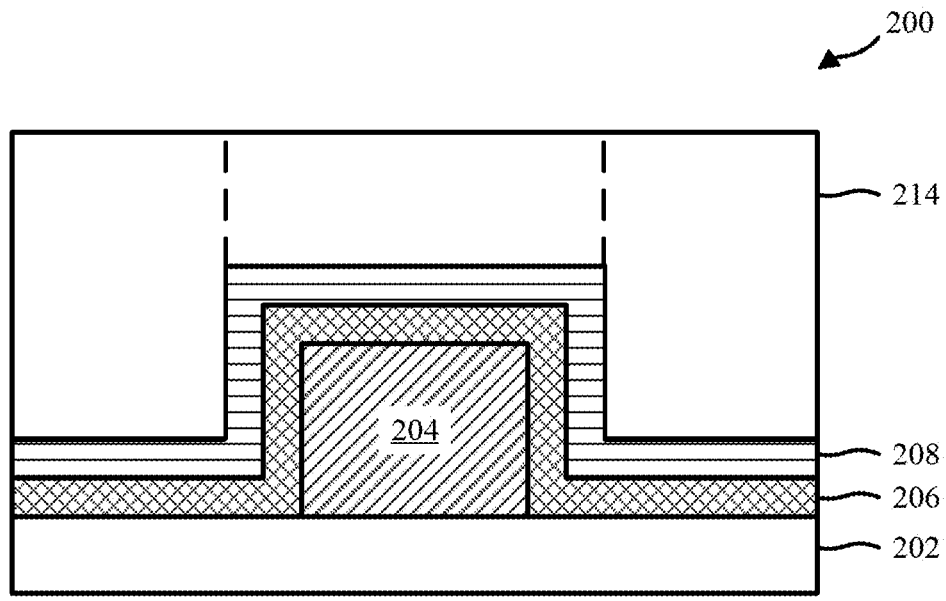
FIG. 7A illustrates a front view of an example of the semiconductor structure of FIG. 6A following the performance of additional fabrication operations, in accordance with embodiments of the present disclosure.
Figure 7B:
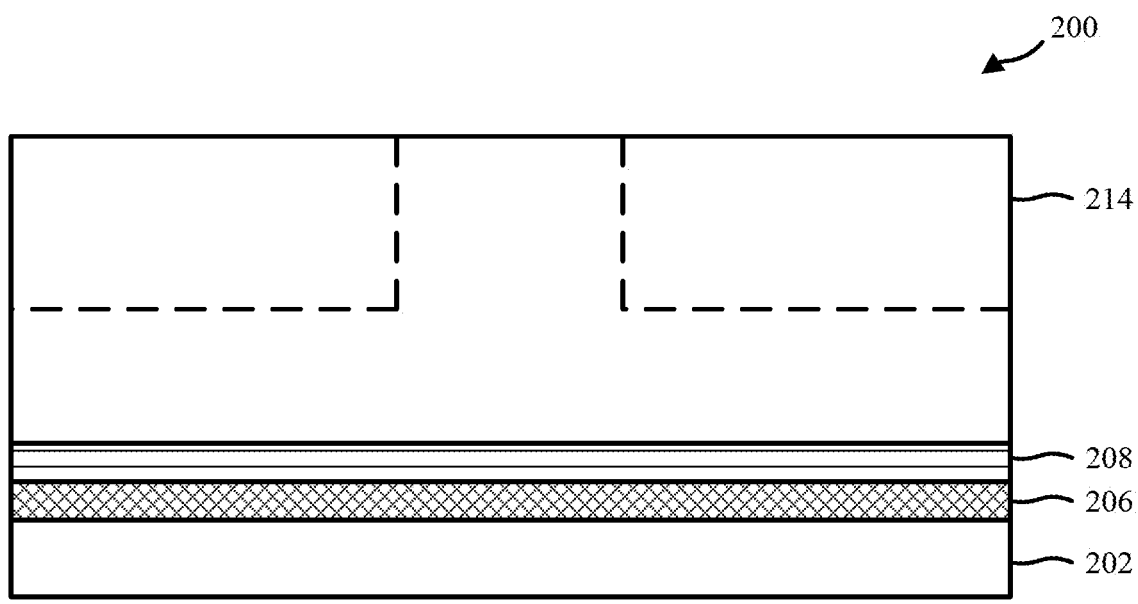
FIG. 7B illustrates a side view of the example semiconductor structure of FIG. 7A, in accordance with embodiments of the present disclosure.
Figure 7C:
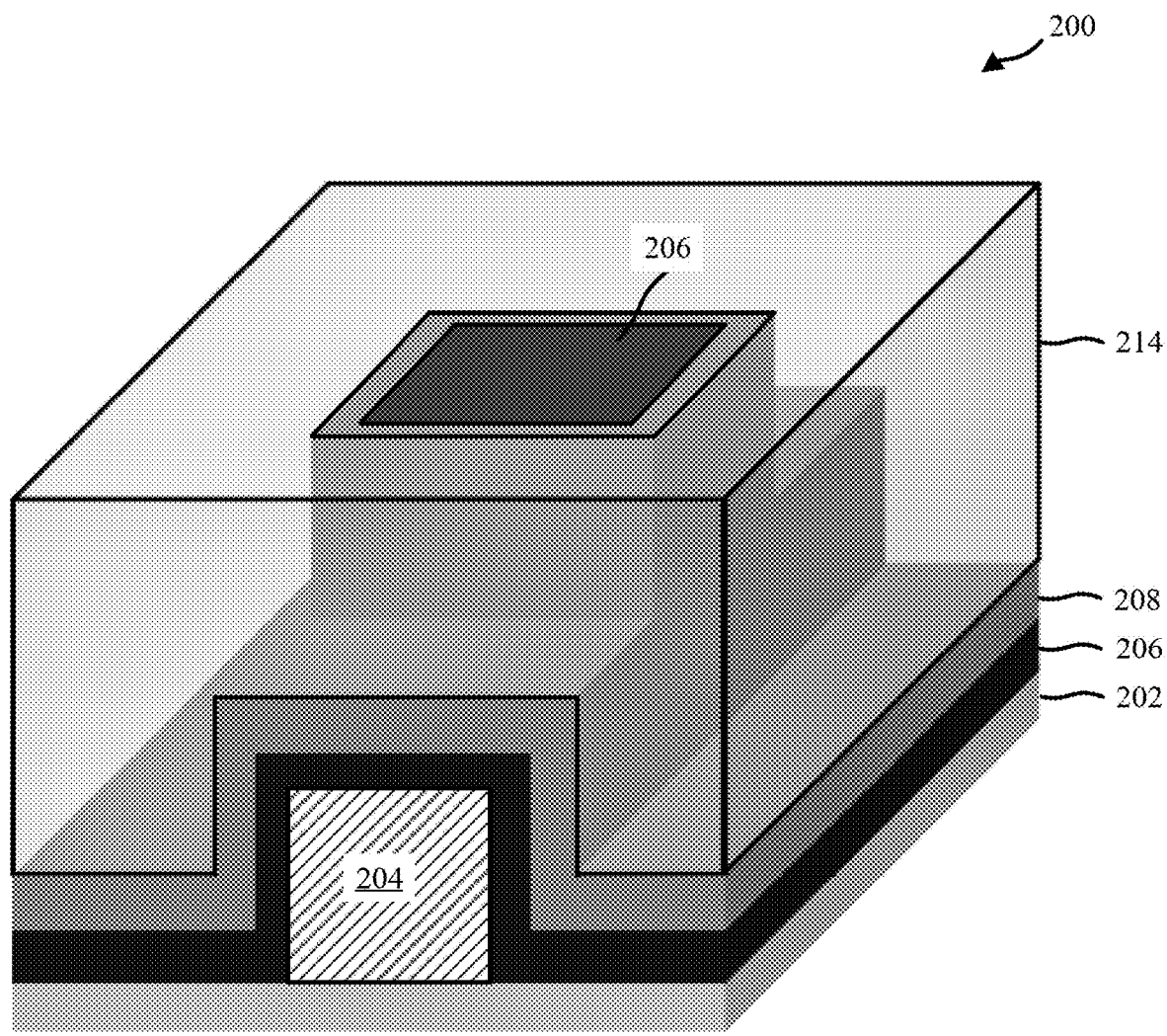
FIG. 7C illustrates an isometric view of the example semiconductor structure of FIG. 7A, in accordance with embodiments of the present disclosure.

FIGS. 7A, 7B, and 7C show a memory device 200 after performance of the entirety of operation 106. As shown in FIGS. 7A-7C, the top of the memory device 200 has been etched back until the top of the memory layer 206 is exposed. In other words, the top of the encapsulation layer 214 and isolation layer 208 are etched until they are substantially coplanar with a top of the memory layer 206. In embodiments where the memory layer 206 comprises multiple layers, such as in an embodiment in which the memory cell is an MTJ, the encapsulation layer 214 and isolation layer 208 are etched until the top of the top memory layer is exposed such that the memory cell can be electrically coupled with other devices.

Returning to FIG. 1, at operation 108, the top electrode layer is formed. Forming the top electrode may comprise forming a barrier layer on top of the exposed memory layer, isolation layer, and low-k dielectric layer, and then forming a top electrode on top of the barrier layer. The barrier layer may act as a conductor between the memory layer and the top electrode, while simultaneously blocking diffusion of the top electrode into the low-k dielectric material. Accordingly, the barrier layer may be any suitable diffusion barrier material, such as TiN. The top electrode may be made of any suitable conductive material, such as W, Cu, Al, Ta, Co, Ru, or Rh. In some embodiment, the top electrode may be the same material as the bottom electrode and/or the via. However, in other embodiments, the top electrode may be a different material than either or both of the bottom electrode and the via.

Figure 8A:
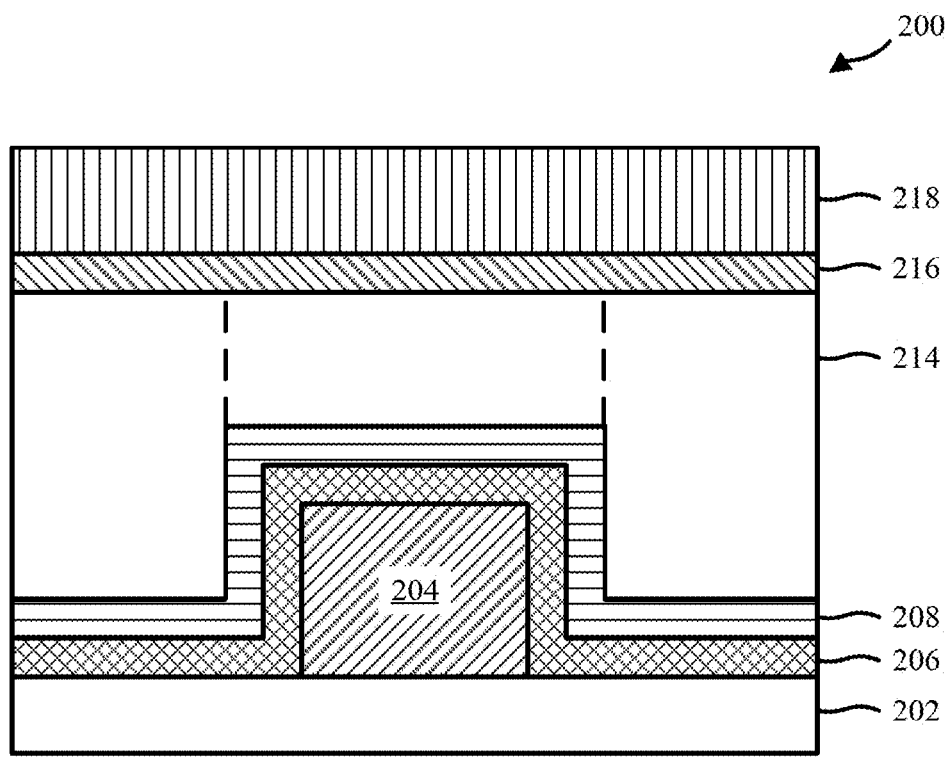
FIG. 8A illustrates a front view of an example of the semiconductor structure of FIG. 7A following the performance of additional fabrication operations, in accordance with embodiments of the present disclosure.
Figure 8B:
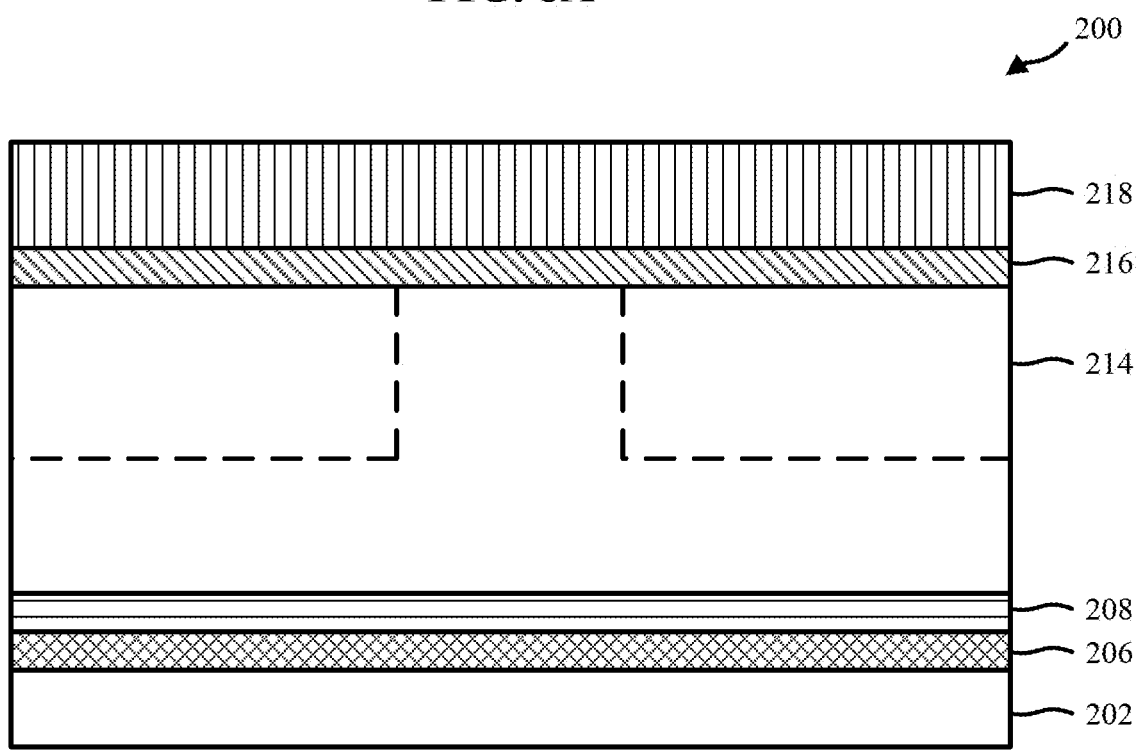
FIG. 8B illustrates a side view of the example semiconductor structure of FIG. 8A, in accordance with embodiments of the present disclosure.

FIGS. 8A and 8B show a memory device 200 after performance of this portion of operation 108. As shown in FIGS. 8A and 8B, a thin film of a barrier metal 216, such as TiN, is formed on top of the memory device. The barrier metal 216 may be formed by, for example, CVD or PVD operations to blanket deposit the barrier metal 216. In the example shown in FIGS. 8A and 8B, the barrier metal 216 is TiN.

A layer of conductive material, such as Ru, Co, Cu, etc., is then formed on top of the barrier metal 216. This conductive material is used to create the top electrode 218. The conductive material may be deposited using any suitable fabrication process. For example CVD or PVD may be used to blanket deposit a conductive material, such as Ru, on top of the barrier metal 216.

Operation 108 may further comprise patterning and etching the barrier metal and the top electrode into their final sizes. For example, operation 108 may comprise etching the top electrode using, for example, an RIE process, thereby exposing a portion of the barrier layer. A wet etch process may then be used to etch away the excess barrier layer material such that the barrier layer is disposed only below the top electrode.

Figure 9A:
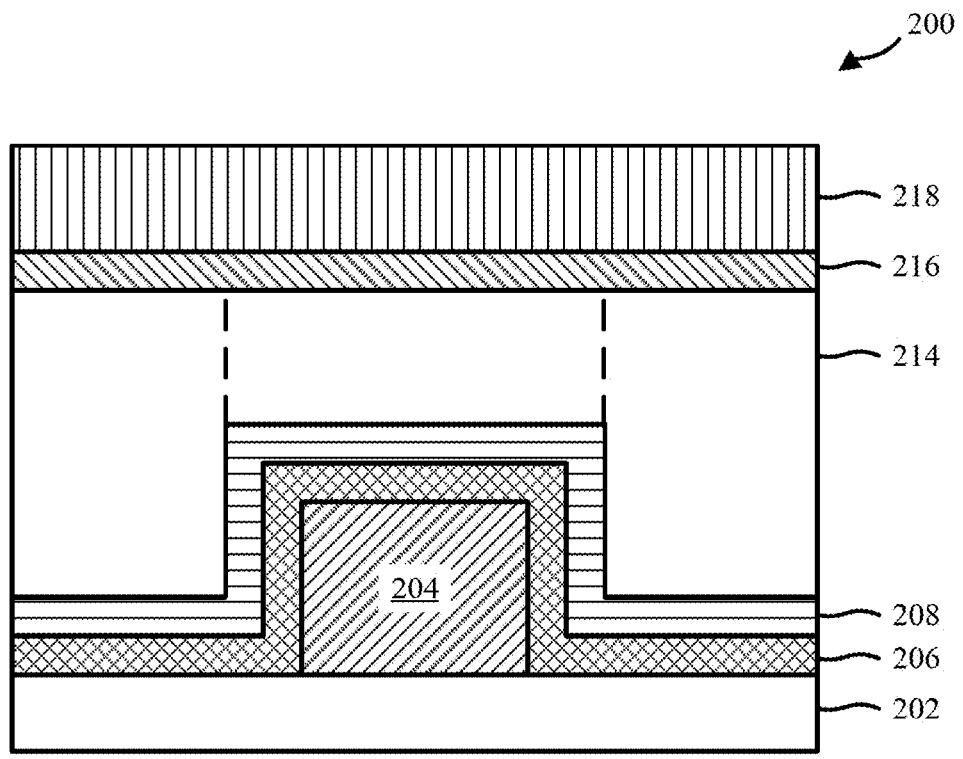
FIG. 9A illustrates a front view of an example of the semiconductor structure of FIG. 8A following the performance of additional fabrication operations, in accordance with embodiments of the present disclosure.
Figure 9B:
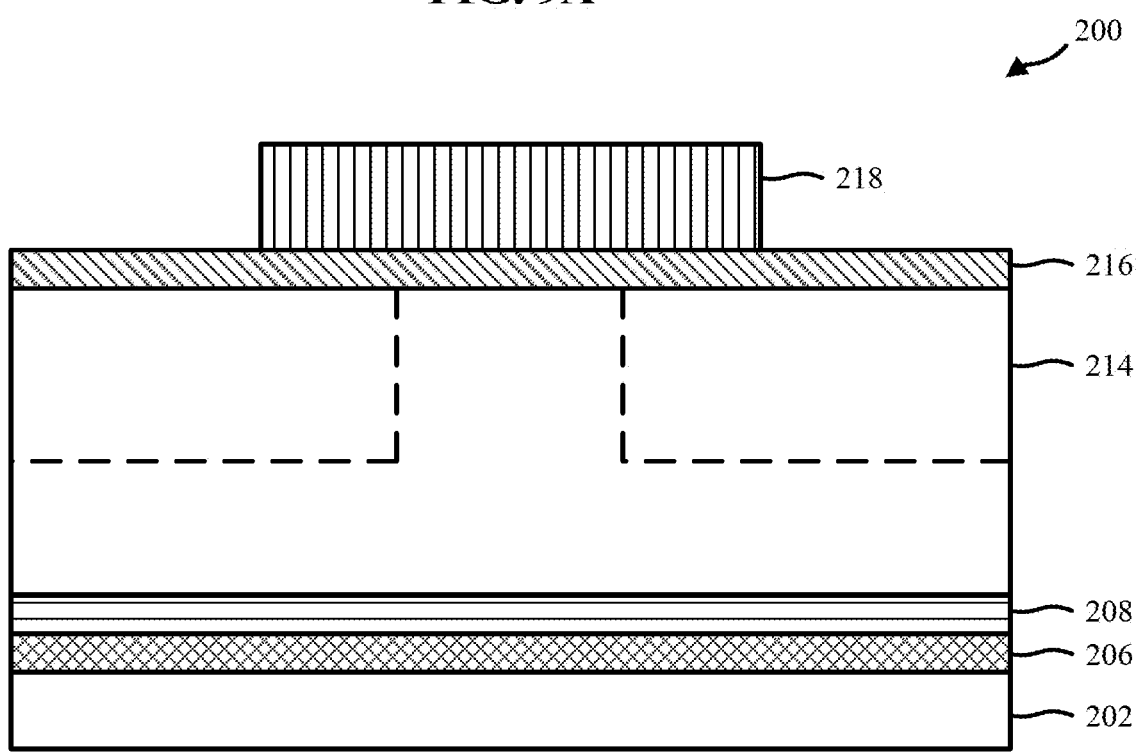
FIG. 9B illustrates a side view of the example semiconductor structure of FIG. 9A, in accordance with embodiments of the present disclosure.
Figure 10A:
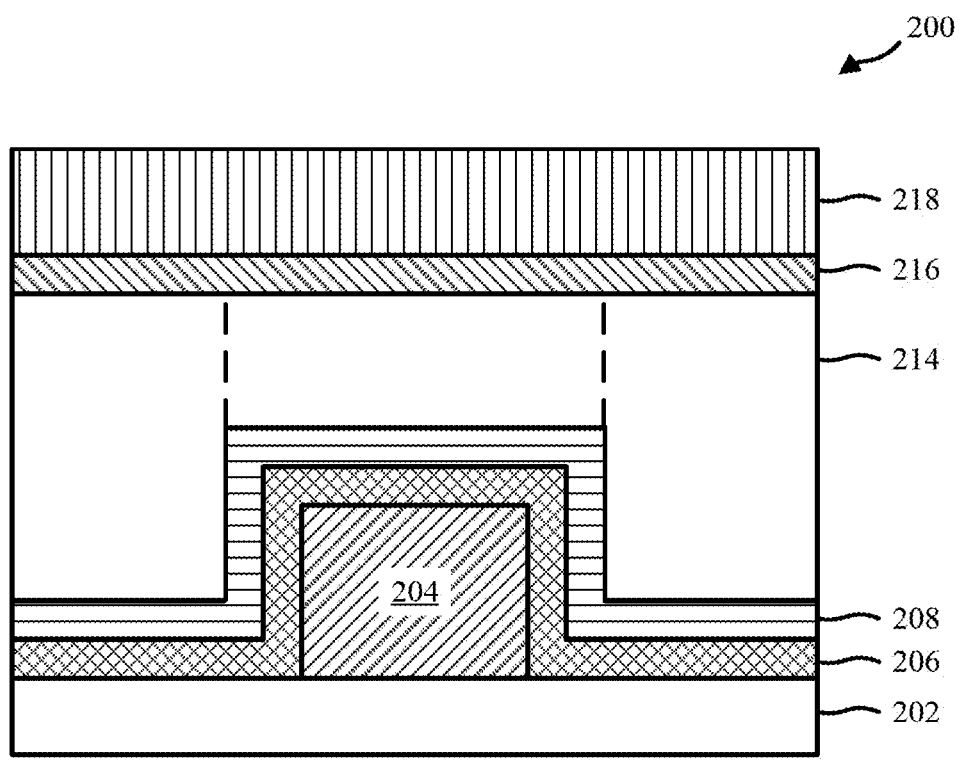
FIG. 10A illustrates a front view of an example of the semiconductor structure of FIG. 9A following the performance of additional fabrication operations, in accordance with embodiments of the present disclosure.
Figure 10B:
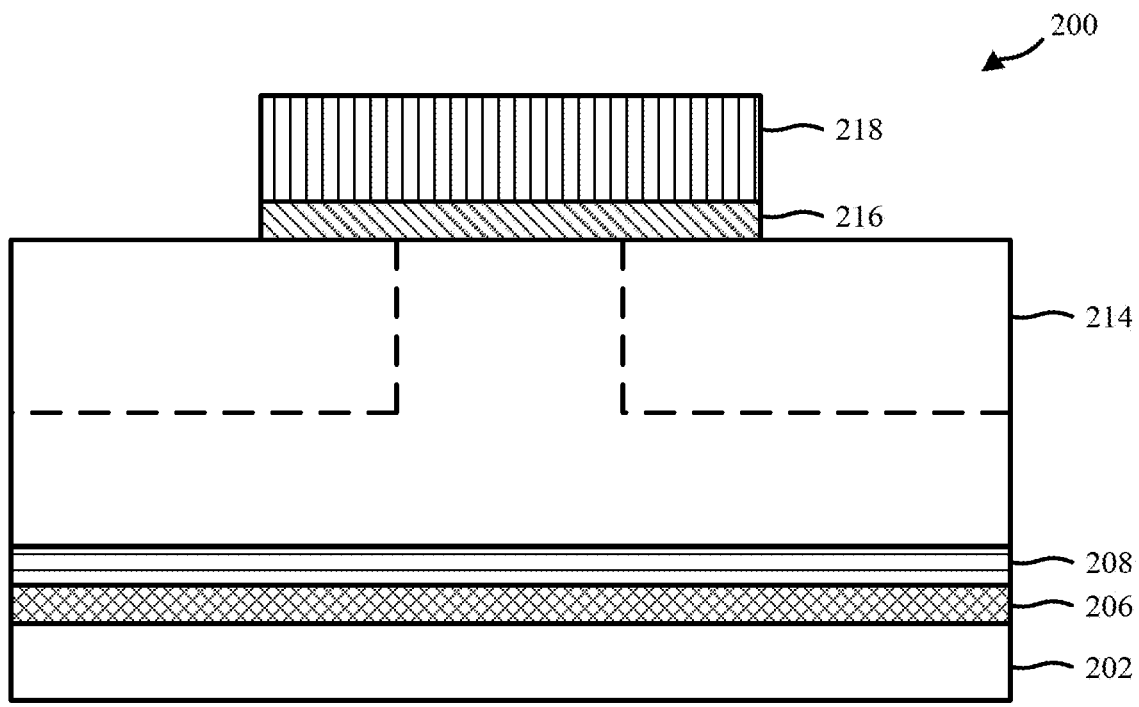
FIG. 10B illustrates a side view of the example semiconductor structure of FIG. 10A, in accordance with embodiments of the present disclosure.
Figure 11:
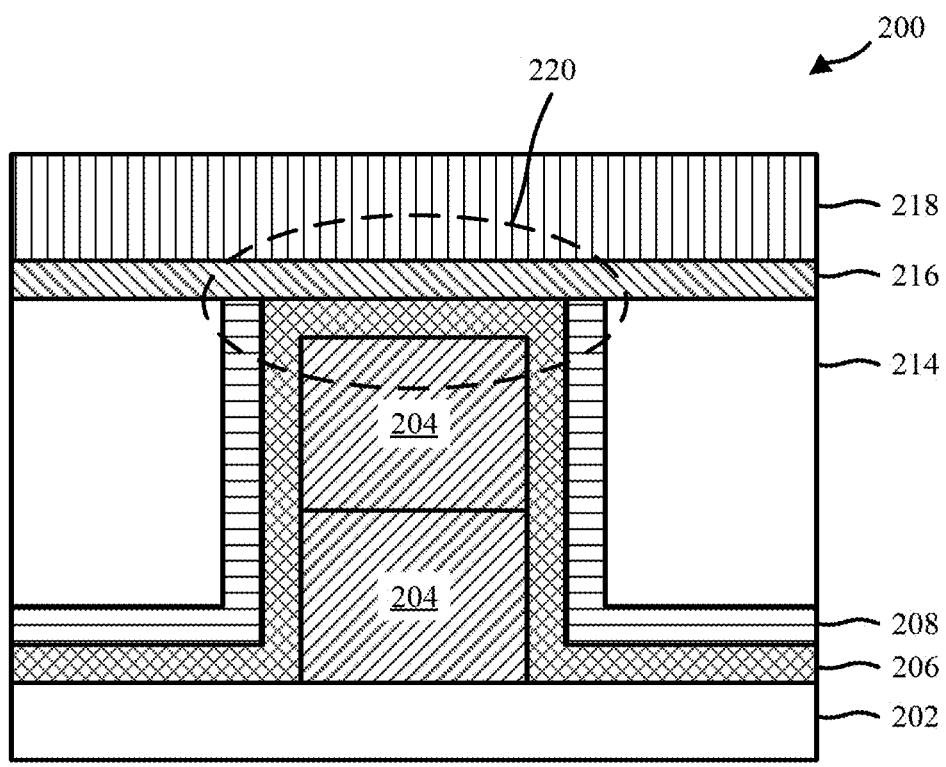
FIG. 11 illustrates a section view of the example memory device of FIG. 2 along cut line A-A', in accordance with embodiments of the present disclosure.

FIGS. 9A-10B show a memory device 200 after performance of these portions of operation 108. In particular, FIGS. 9A and 9B show the memory device 200 after performing the ME process to etch the top electrode 218, and FIGS. 10A and 10B show the memory device after performing the wet etch process to remove extraneous portions of the barrier layer 216. As shown in FIG. 10B, the barrier layer 216 is etched such that it is remove from portions of the encapsulation layer 214 that are not directly under the top electrode 218.

After performance of operation 108, the method 100 may end.

Returning to FIG. 2, shown is an isometric view of the memory device 200 after performance of the method 100. As shown in FIG. 2, the resulting memory device 200 comprises a bottom electrode 210 and top via 212 stacked on top of a substrate 202. The bottom electrode 210 and top via 212 are made of a conductive metal material 204, such as Ru. However, in some embodiments, the bottom electrode 210 and the via 212 may be made of different conductive materials. For example, the bottom electrode 210, which may act as a line interconnect, may be made of Cu, while the top via 212 may be made of a different conductive material, such as Ru.

The memory device 200 comprises a memory stack deposited on top of the bottom electrode 210 and the top via 212. In particular, the memory stack comprises a memory material 206 and an isolation layer 208. The memory material 206 in the example shown in FIG. 2 is HfOx, and the isolation layer 208 is SiN. Accordingly, the example shown in FIG. 2 illustrates an example memory device in which an RRAM memory cell is embedded in a top via 212. However, it is to be understood that other memory structures or components, such as MTJs for MRAM cells, can be fabricated on the top via 212.

An encapsulation layer 214 is deposited on top of the isolation layer and surrounds the bottom electrode 210, the top via 212, and the memory cell that has been fabricated on top of the top via 212. The encapsulation layer 214 has been made transparent in FIG. 2 in order to illustrate the internal structures of the memory device 200; however, in practice the encapsulation layer 214 may not be transparent.

A second level metallization layer sits on top of the memory stack. The second level metallization layer comprises a barrier layer 216 (e.g., a diffusion barrier, such as TiN) and a top line interconnect 218, which acts as the top electrode of the memory cell.

Referring now to FIG. 11, shown is a sectional view of the complete memory device 200 of FIG. 2 along cut line A-A', in accordance with embodiments of the present disclosure. The sectional view show the bottom electrode and via material 204 deposited on a substrate 202. A memory layer 206 is deposited on top of the bottom electrode and via material 204, as well as a portion of the substrate 202. An isolation layer 208 is deposited on top of the portion of the memory layer 206 that is on the substrate 202. The isolation layer 208 also is deposited along the vertical sidewalls of the memory layer 206. However, the top of the memory layer 206 is in direct contact with the second level metallization layer, which comprises a diffusion barrier 216 and a top line, which acts as the top electrode 218.

As a result of this stack, the memory layer 206 is in direct electrical contact with the bottom line and via, as well as with the second level metallization layer. This creates an active region 220 in the memory device 200, which acts as a memory cell. In the example shown in FIG. 11, which uses HfOx as the memory layer 206, the active region 220 is a RRAM cell. By applying an electromagnetic field across this region, the properties of the memory layer 206 can be modified to change the electrical resistance of the active region 220. This allows the active region 220 to be programmed into a particular resistance state. This resistance can then be measured as current flows from the top line 218 to bottom electrode (or the other way around) to determine the state of the memory cell, which can be converted into a value (e.g., a binary value, such as 0 or 1).

It is to be understood that the aforementioned advantages are example advantages and should not be construed as limiting. Embodiments of the present disclosure can contain all, some, or none of the aforementioned advantages while remaining within the spirit and scope of the present disclosure.

Detailed embodiments of the structures of the present invention are described herein. However, it is to be understood that the embodiments described herein are merely illustrative of the structures that can be embodied in various forms. In addition, each of the examples given in connection with the various embodiments of the invention is intended to be illustrative, and not restrictive. Further, the figures are not necessarily to scale, some features can be exaggerated to show details of particular components. Therefore, specific structural and functional details described herein are not to be interpreted as limiting, but merely as a representative basis for teaching one skilled in the art to variously employ the methods and structures of the present description It should also be understood that material compounds will be described in terms of listed elements, e.g., SiN, SiCN, SiCO, or SiGe. These compounds include different proportions of the elements within the compound, e.g., SiGe includes $Si_xGe_{(1-x)}$ where x is less than or equal to 1, and the like. In addition, other elements can be included in the compound and still function in accordance with the present principles. The compounds with additional elements will be referred to herein as alloys.

It should be noted that not all masking, patterning, and lithography processes are shown because a person of ordinary skill in the art would recognize where masking and patterning processes are utilized to form the identified layers and openings, and to perform the identified selective etching processes, as described herein.

The descriptions of the various embodiments of the present invention have been presented for purposes of illustration, but are not intended to be exhaustive or limited to the embodiments described. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments described herein.

What is claimed is:

1. A memory cell comprising:
   a bottom electrode that comprises a via arranged on top of a bottom line;
   a memory stack arranged at least upon the via, wherein the memory stack comprises:
   one or more memory layers that are configured to store data, the one or more memory layers in direct contact with a top surface and in direct contact with a lateral side(s) of the via; and
   an isolation layer in contact with the one or more memory layers;
   an encapsulation layer at least in contact with the isolation layer, wherein a top surface of the encapsulation layer, a top surface of the one or more memory layers, and a top surface of the isolation layer are substantially coplanar;
   a top metallization layer arranged on top of the memory stack and the encapsulation layer, wherein
   the top metallization layer comprises:
   a diffusion barrier deposited on top of the memory stack, the isolation layer and the encapsulation layer; and
   a top electrode arranged on top of the diffusion barrier; and
   the top electrode layer is in direct contact with a top surface of the diffusion barrier.

2. The memory cell of claim 1, wherein the one or more memory layers comprise a high-k gate dielectric that is capable of acting as an RRAM element.

3. The memory cell of claim 2, wherein the high-k gate dielectric is $HfO_2$.

4. The memory cell of claim 1, wherein the isolation layer is SiN.

5. The memory cell of claim 1, wherein the top electrode is a line.

6. The memory cell of claim 1, wherein the diffusion barrier is TiN.

7. The memory cell of claim 1, wherein the one or more memory layers comprise an MTJ stack.

8. A memory cell comprising:
   a bottom electrode that comprises a via upon a bottom line, the bottom line arranged along a first direction;

a memory stack upon the via, wherein the memory stack comprises:

one or more memory layers that are configured to store data, the one or more memory layers in direct contact with a top surface of the bottom line and in direct contact with a lateral side(s) of the via; and an isolation layer directly upon the one or more memory layers;

an encapsulation layer directly upon the isolation layer, wherein a top surface of the encapsulation layer, a top surface of the one or more memory layers, and a top surface of the isolation layer are substantially coplanar; and a top electrode arranged in a second direction that is substantially perpendicular to the first direction, wherein the top electrode comprises:

a diffusion barrier deposited on top of the memory stack, the isolation layer and the encapsulation layer; and a top electrode conductor arranged on top of the diffusion barrier; and the top electrode conductor is in contact with at least the top surface of the diffusion barrier.

9. The memory cell of claim 8, wherein the one or more memory layers comprise a high-k gate dielectric that is capable of acting as an RRAM element.

10. The memory cell of claim 9, wherein the high-k gate dielectric is $HfO_2$.

11. The memory cell of claim 8, wherein the isolation layer is SiN.

12. The memory cell of claim 8, wherein the top electrode is a line.

13. The memory cell of claim 8, wherein the diffusion barrier is TiN.

14. The memory cell of claim 8, wherein the one or more memory layers comprise an MTJ stack.

15. A memory cell comprising:

a bottom line associated with a via thereupon, the bottom line arranged along a first direction;

a memory stack upon the via, wherein the memory stack comprises:

one or more memory layers that are configured to store data, the one or more memory layers in direct contact with a top surface of the bottom line and in direct contact with a lateral side(s) of the via; and an isolation layer directly upon the one or more memory layers;

an encapsulation layer directly upon the isolation layer, wherein a top surface of the encapsulation layer, a top surface of the one or more memory layers, and a top surface of the isolation layer are substantially coplanar; and a top line arranged in a second direction that is substantially perpendicular to the first direction, wherein the top line comprises:

a diffusion barrier deposited on top of the memory stack, the isolation layer and the encapsulation layer; and a top electrode conductor arranged on top of the diffusion barrier; and the top electrode conductor is in contact with the top surface of the diffusion barrier.

16. The memory cell of claim 15, wherein the one or more memory layers comprise a high-k gate dielectric that is capable of acting as an RRAM element.

17. The memory cell of claim 16, wherein the high-k gate dielectric is $HfO_2$.

* * * * *